United States Patent
Chabinyc et al.

(10) Patent No.: US 7,566,899 B2
(45) Date of Patent: Jul. 28, 2009

(54) ORGANIC THIN-FILM TRANSISTOR BACKPLANE WITH MULTI-LAYER CONTACT STRUCTURES AND DATA LINES

(75) Inventors: Michael L. Chabinyc, Burlingame, CA (US); Rene A Lujan, Sunnyvale, CA (US); Ana Claudia Arias, San Carlos, CA (US); Jackson H. Ho, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/316,551

(22) Filed: Dec. 21, 2005

(65) Prior Publication Data

US 2007/0158644 A1   Jul. 12, 2007

(51) Int. Cl.
*H01L 51/10* (2006.01)
*G02F 1/1345* (2006.01)

(52) U.S. Cl. .............. 257/40; 257/448; 257/E51.006; 349/151

(58) Field of Classification Search ............ 257/40, 257/E51.001–E51.052, 431, 443–444, 448; 438/99; 349/149, 151
See application file for complete search history.

(56) References Cited

U.S. PATENT DOCUMENTS

| | | | |
|---|---|---|---|
| 5,854,139 A * | 12/1998 | Aratani et al. ............. | 438/780 |
| 6,281,634 B1 * | 8/2001 | Yokoyama ............... | 315/169.3 |
| 6,555,411 B1 * | 4/2003 | Bao et al. ................. | 438/99 |
| 6,806,124 B2 | 10/2004 | Klauk et al. | |
| 6,891,190 B2 * | 5/2005 | Lian et al. ................. | 257/40 |
| 7,256,064 B2 * | 8/2007 | Hanna et al. .............. | 438/82 |
| 2003/0102472 A1 * | 6/2003 | Kelley et al. .............. | 257/40 |
| 2003/0104649 A1 * | 6/2003 | Ozgur et al. .............. | 438/50 |
| 2004/0012017 A1 * | 1/2004 | Nagayama ............... | 257/40 |
| 2004/0134878 A1 * | 7/2004 | Matsushita et al. ........ | 216/23 |
| 2004/0161873 A1 * | 8/2004 | Dimitrakopoulos et al. ... | 438/99 |
| 2005/0042548 A1 | 2/2005 | Klauk et al. | |
| 2005/0127357 A1 | 6/2005 | Wong et al. | |
| 2005/0263756 A1 * | 12/2005 | Yatsunami et al. ......... | 257/40 |

(Continued)

OTHER PUBLICATIONS

Dwight, John. Aluminum Design and Construction. Taylor & Francis Group: London and New York (1999). Chapter 1.*

(Continued)

*Primary Examiner*—Douglas M Menz
*Assistant Examiner*—Matthew W Such
(74) *Attorney, Agent, or Firm*—Bever, Hoffman & Harms, LLP; Patrick T. Bever

(57) ABSTRACT

A backplane circuit includes an array of organic thin-film transistors (OTFTs), each OTFT including a source contact, a drain contact, and an organic semiconductor region extending between the source and drain contacts. The drain contacts in each row are connected to an address line. The source and drain contacts and the address lines are fabricated using a multi-layer structure including a relatively thick base portion formed of a relatively inexpensive metal (e.g., aluminum or copper), and a relatively thin contact layer formed of a high work function, low oxidation metal (e.g., gold) that exhibits good electrical contact to the organic semiconductor, is formed opposite at least one external surface of the base, and is located at least partially in an interface region where the organic semiconductor contacts an underlying dielectric layer.

19 Claims, 5 Drawing Sheets

U.S. PATENT DOCUMENTS

| | | | |
|---|---|---|---|
| 2006/0086978 A1* | 4/2006 | Kobayashi | 257/347 |
| 2006/0108581 A1* | 5/2006 | Ahn et al. | 257/40 |
| 2006/0131570 A1* | 6/2006 | Meng | 257/40 |
| 2006/0157690 A1* | 7/2006 | Lee et al. | 257/40 |
| 2006/0273303 A1* | 12/2006 | Wu et al. | 257/40 |

OTHER PUBLICATIONS

Chesterfield et al.: "Variable Temperature Film And Contact Resistance Measurements On Operating n-Channel Organic Thin Film Transistors", Journal of Applied Physics, vol. 95, No. 11, Jun. 1, 2004, pp. 6396-6405.

Chih-Wei Chu et al.: "High-Performance Organic Thin-Film Transistors With Metal Oxide/Metal Bilayer Electrode", Applied Physics Letters 87, 193508 (2005), 2005 American Institute of Physics, 3 pgs.

Bürgi et al.: Close Look At Charge Carrier Injection In Polymer Field-Effect Transistors, Journal of Applied Physics, vol. 94, No. 9, Nov. 1, 2003, pp. 6129-6137.

Blanchet et al.: "Large Area, High Resolution, Dry Printing Of Conducting Polymers For Organic Electronics", Applied Physics Letters, vol. 82, No. 3, Jan. 20, 2003, pp. 463-465.

Facchetti et al.: "n-Type Building Blocks For Organic Electronics: A Homologous Family Of Fluorocarbon-Substituted Thiophene Oligomers With High Carrier Mobility", Advanced Materials, 2003, 15, No. 1, Jan. 3, pp. 33-38.

Kane: "Printed Organic Transistors On Plastic For Electronic Displays And Circuits", Mar. 17, 2003, Sarnoff Corporation, Princeton, NJ., 29 pgs.

* cited by examiner

ORGANIC THIN-FILM TRANSISTOR BACKPLANE WITH MULTI-LAYER CONTACT STRUCTURES AND DATA LINES

FIELD OF THE INVENTION

This invention was made with Government support under 70NANBOH 3033 awarded by NIST/ATP. The Government has certain rights in this invention. Further, this invention relates to semiconductor processing, more particularly, the invention relates to the fabrication of organic thin-film transistors (OTFT) backplanes.

BACKGROUND OF THE INVENTION

In recent years, large area thin-film transistor (TFT) backplanes have found important applications in the production of pixelated devices such as imaging devices, display devices, and sensor devices. TFT array backplanes generally include an array of TFTs and associated address and data lines formed on a flexible or rigid substrate, with each TFT of the array arranged to access (i.e., independently control) an associated image capturing region, sensor region or display generating region. Each TFT and its associated image/sensing/display region is typically referred to as a pixel of the imaging/sensing/display device, and each pixel is accessed during operation using well known addressing circuitry by way of the address/data lines either to transfer data from the pixel to external processing circuitry, or to transfer display data to the pixel.

TFT backplanes are typically fabricated on rigid or flexible substrates using known fabrication techniques. In some conventional imaging and display devices, TFT backplanes include a first metal layer that is patterned to form a series of gate structures and associated address lines that are formed on the substrate, a dielectric layer formed over the gates/address lines, and a second metal layer that is patterned to from source and drain contact structures and associated data lines. A conventional semiconductor (e.g., amorphous silicon) is patterned between the source and drain contacts over the gate. Image capturing or display generating portions of the imaging/display device are then formed over the TFT backplane and connected to the source contact using known techniques.

Recently organic semiconductors (examples include pentacene, α-ω-dihexylsexithiophene, poly(3-hexylthiophene), and poly[5,5'-bis(3-dodecyl-2-thienyl)-2,2'-bithiophene]) have been used to form organic TFT (OTFT) arrays. Such organic semiconductors are preferred due to their compatibility with flexible substrates. Using organic semiconductors also reduces fabrication costs. One reason for the lower fabrication costs is that solution-processable organic semiconductors can be patterned using jet printing, screen printing, or micromechanical molding techniques. Jet printing is described in U.S. Pat. No. 5,972,419 "Electroluminescent Display and Method for Making the Same", WO0146987A2 "Inkjet-Fabricated Integrated Circuits"; screen printing is described in "All-Polymer Field Effect Transistor Realized by Printing Techniques" F. Garnier, R. Hajlaoui, A. Yassar, P. Srivastava Science 265 1994 p 1684-1686, and micromolding is described in U.S. Pat. No. 6,322,736 "Method for Fabricating Molded Microstructures on Substrates" which are all hereby incorporated by reference.

High performance OTFTs typically require source and drain contacts that are made from metals that allow good injection of carriers into them. For p-type organic semiconductors, such as pentacene or poly(3-hexylthiophene), good injection occurs with contact metals that have a high work function (near 5 eV), and generally do not form thick oxide layers during fabrication. Doped semiconducting polymers, such as poly(3,4-ethylenedioxythiophene) and polyaniline, have also been used to form contacts with good carrier injection properties, but these materials generally have a low conductivity relative to metals and are inadequate for circuitry that requires high conductivity interconnects. For n-type organic semiconductors, such as those based on perylene tetracarboxylic dimide or perfluoroalkyl thiophenes, low work function electrodes such as calcium may be required, but in some cases higher work function metals have been shown to be adequate. If OTFTs are fabricated solely with high conductivity metals (e.g., aluminum and copper) that generate oxides or poorly matched work functions, the OTFTs exhibit a poor electrical contact to the organic semiconductor, a parasitic contact resistance between the source/drain contact and the organic semiconductor material, which degrades the performance of the OTFT. A precious metal, typically gold, is preferably used to produce the source and drain contacts in high performance OTFTs due to its high work function and lack of a native oxide layer. However, gold may be cost-prohibitive for manufacturing displays in which large areas must be covered with the contact metal, and the waste of metal is high. Other precious metals known to form good electrical contacts to organic semiconductors include palladium and platinum, but these precious metals are typically as expensive or more expensive than gold, and therefore present the same cost-related problems in large area displays.

To minimize the high costs OTFT manufacturing associated with the use of precious metals, it has been proposed to form the OTFT source and drain electrodes using less expensive doped semiconducting polymers, such as poly(3,4-ethylenedioxythiophene) or polyaniline, or composites of them with small particles of conductors, such as carbon nanotubes, and to form the address lines from a less expensive, high conductivity metal, such as aluminum. However, these two-part approaches are complicated by the need to deposit and pattern two separate conductive materials, which increases production complexity and costs and, hence, effectively cancels the cost benefits of avoiding the use of precious metals.

What is needed is an OTFT-based backplane circuit and fabrication method that minimizes manufacturing costs while providing efficient carrier injection into the organic semiconductor.

SUMMARY OF THE INVENTION

The present invention is directed to a backplane circuit for a pixelated (e.g., display or imaging) device in which both the organic thin-film transistor (OTFT) source/drain structures and the associated address lines are integrally (simultaneously) formed using a multiple layer (multi-layer) contact/data-line structure. The multi-layer structure includes a relatively thick base portion formed using a relatively inexpensive first material metal (e.g., aluminum), and a relatively thin contact layer of a material that has a relatively low electrical contact resistance to (i.e., allows good carrier injection into) the organic semiconductor. In the case of a p-type organic material, the thin contact layer is typically a relatively expensive material having a relatively high work function (e.g., gold). This multi-layer structure provides the efficient carrier injection associated with conventional gold-only contact structures while substantially reducing fabrication costs by requiring only a fraction of the gold. In addition, the inexpensive base portion preserves the reliable conductivity of the associated address lines, thus facilitating the thin contact layer without risking high address line resistance. More-over, the multi-layer structure greatly simplifies the fabrication process because the address lines and source/drain contacts are formed simultaneously using a single mask and the same materials, thus avoiding the complexity and expense associated with conventional two-part approaches, mentioned above, in which the source/drain contacts are fabricated separately from the associated address lines. Accordingly, the present invention provides OTFT-based backplane circuits characterized both by OTFTs that exhibit the efficient carrier injection associated with gold-only contact/address line structures, and by low manufacturing costs that are comparable with conventional backplanes produced using aluminum-only contact/address line structures.

In accordance with an aspect of the present invention, the thin contact layer is disposed opposite to at least one surface of the base portion (i.e., extending horizontally below a lower surface or above an upper surface, and/or extending vertically along side surfaces of the base portion) such that at least a portion of the contact layer is located in an interface region defined by a junction of the source/drain structure, the organic semiconductor and dielectric layer. By locating a portion of the contact layer in this interface region, the contact layer may be extremely thin (e.g., ⅕ the thickness of the base portion) while still providing carrier injection into the organic semiconductor that is substantially more efficient than that exhibited by conventional OTFTs having low cost (e.g., aluminum) contact structures.

In accordance with another aspect of the present invention, the multi-layer contact/data-line structure includes two or more separate materials. In one embodiment, a bilayer structure is formed by a base portion (e.g., copper or aluminum) and a single contact layer material (e.g., a precious metal (e.g., gold) or a highly conductive polymer (e.g., poly(3,4-ethylenedioxythiophene) (PEDOT) or polyaniline (PANI)). In another embodiment, one or more additional layers may be utilized, for example, to enhance the adhesion of the contact layer material to the base portion. For example, nickel and/or zinc may be formed on the base portion prior to the formation of an outer gold contact layer. In another embodiment, a multi-layer contact/data-line structure may include a contact layer structure including a thin adhesion layer of chromium, a thin layer of gold, and a thicker capping layer of titanium-tungsten (TiW) alloy.

In an embodiment of the present invention, the OTFT source/drain structures and the associated address lines are formed on a dielectric layer, and a gate electrode is positioned under an organic semiconductor region that is located between the source and drain structures. In alternative specific embodiments, the contact layer is formed on side surfaces, a top surface, and/or under the base portion of each of the source/drain structures and the associated address lines.

In another embodiment of the present invention, the OTFT source/drain structures and the associated address lines are formed, the organic semiconductor is deposited, and overcoated with a dielectric, and a gate electrode is positioned on the dielectric over a gap between the source and drain structures.

In accordance with another embodiment of the present invention, a backplane circuit is produced by forming the base portions of the source/drain structures and the address lines, and then plating the contact layer onto the base portions by electroless plating, or in the case of a polymer, using a chemical bath to prepare the base portion for polymer attachment. Because substantially all of the relatively expensive contact layer material becomes adhered to the base portions during the plating process, this method minimizes the waste of the contact layer material, thus minimizing overall fabrication costs.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in OTFT-based backplane circuits that can be used, for example, in display devices and imaging devices. The following description is presented to enable one of ordinary skill in the art to make and use the invention as provided in the context of a particular application and its requirements. As used herein, directional terms such as "upper", "lower", "side", "front", "rear", are intended to provide relative positions for purposes of description, and are not intended to designate an absolute frame of reference. In addition, the phrases "integrally connected" and "integrally fabricated" are used herein to describe the connective relationship between two portions of a single deposited or plated structure, and are distinguished from the terms "connected", "formed" or "fabricated" (without the modifier "integrally"), which indicates two structures that are formed at different times. Further, the terms "source" and "drain" are used to identify opposing contacts (terminals) of an OTFT, and are not intended to define the operational characteristics of the OTFT and surrounding circuit (i.e., the address line may technically be integrally connected to the OTFT "source" contact in some embodiments, but for clarity is described herein as being integrally connected to the drain contact). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
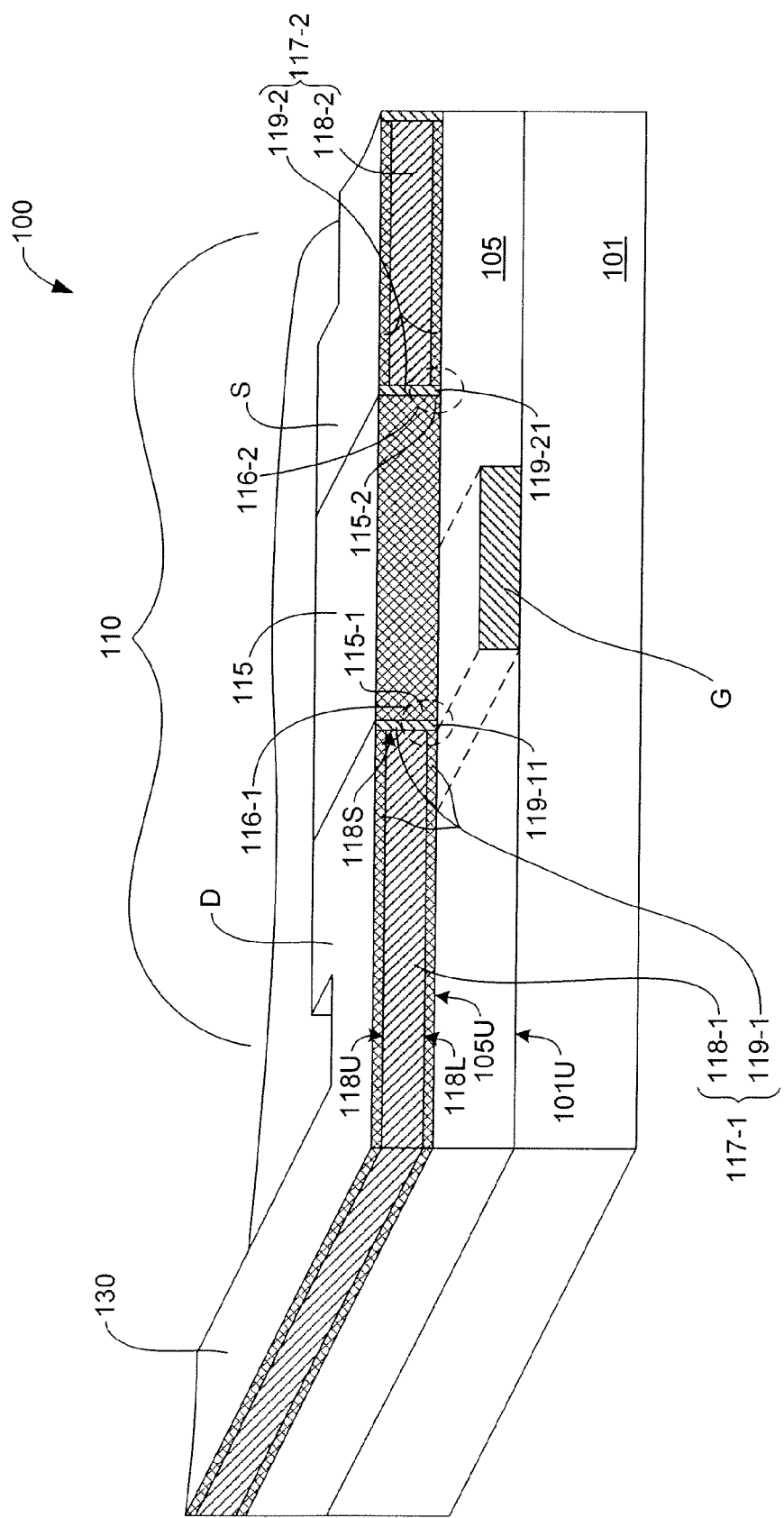
FIG. 1 is a top side perspective view showing a portion of an exemplary TFT backplane circuit including source and drain contact structures an a portion of a data line formed in accordance with an embodiment of the present invention.

FIG. 1 shows a portion of an exemplary OTFT backplane circuit 100 that is fabricated in accordance with an embodiment of the present invention. Backplane circuit 100 generally includes a substrate 101, a dielectric layer 105 formed on an upper surface 101U of substrate 101, an array of OTFTs 110 (one shown), and a series of address lines including a gate line (not shown) formed on upper surface 101U of substrate 101 and a series of data lines 130 (partially shown on the left side of FIG. 1). Substrate 101 is, in one embodiment, an inexpensive, flexible polymer film based on polyethylene naphthalate, polyethylene terephthalate, polyethylene, polypropylene, polystyrene, epoxy resins, polyimides, polybenzoxazoles, polyethers and their variants. In other embodiments, substrate 101 is one of flexible metal foils, glass, or quartz. Dielectric layer 105 (e.g., silicon dioxide, silicon nitride, or cross-linked poly(vinylphenol)) is formed according to known techniques. OTFTs 110 and the associated address lines are fabricated in the manner described below.

Figure 2A:
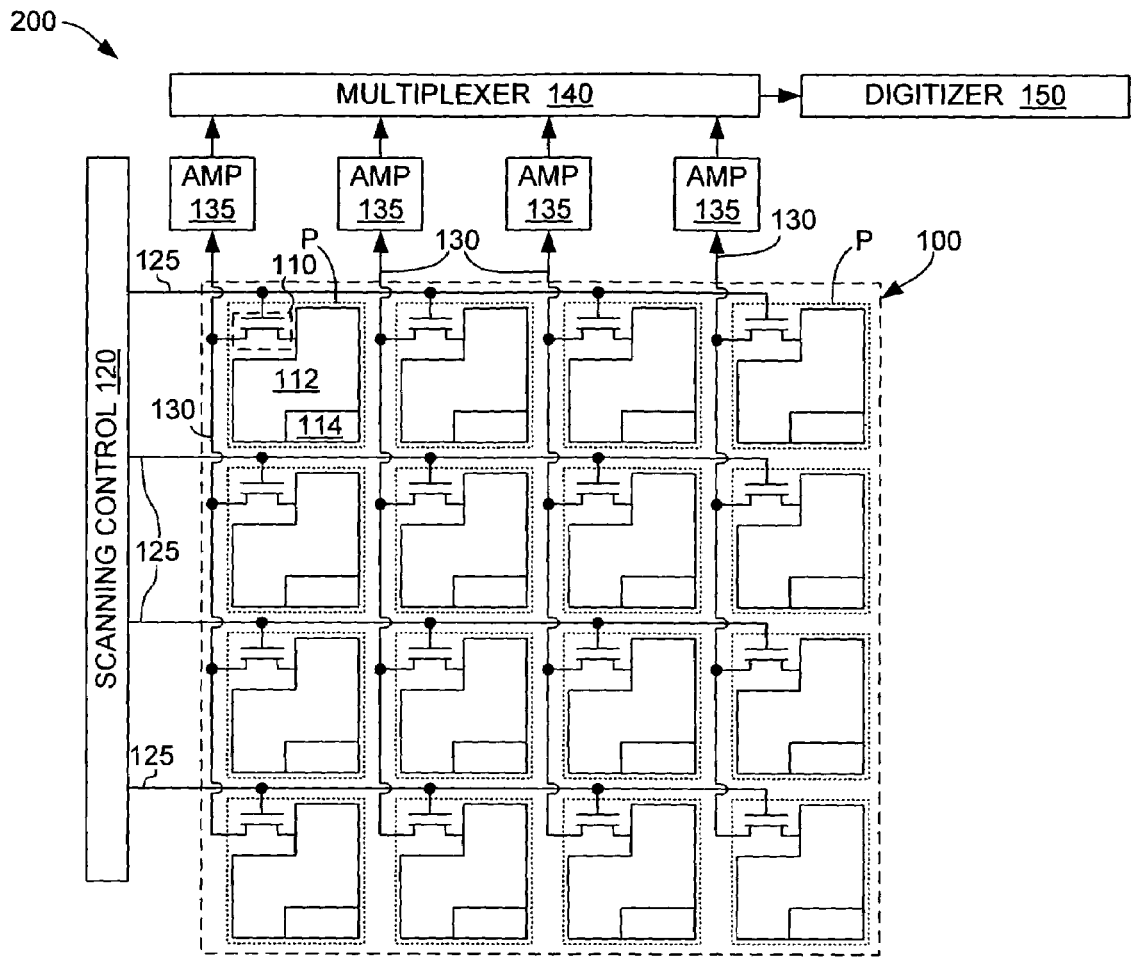
FIG. 2(A) is a simplified diagram showing an exemplary display device including the backplane circuit of FIG. 1 according to another embodiment of the present invention.

FIG. 2(A) shows a simplified image sensor 200, which represents an integrated circuit device incorporating exemplary OTFT backplane circuit 100 according to a practical embodiment of the present invention. FIG. 2(A) shows that backplane circuit 100 includes an array of pixels P, each pixel P including an OTFT 110 identical to that shown in FIG. 1, a sensor 112, and an optional storage capacitor 114. An external scanning control circuit 120 turns on the OTFTs 110 one row at a time via a series of parallel gate lines 125. As each row of OTFTs 110 is turned on, an image charge is transferred from the corresponding sensors 112 to a series of parallel data (address) lines 130, which are respectively coupled to external readout amplifiers 135. At the same time, readout amplifiers 135 reset the potential at each sensor 112. The resulting amplified signal for each row is multiplexed by a parallel-to-serial converter or multiplexer 140, and then transmitted to an analog-to-digital converter or digitizer 150 according to known techniques.

Figure 2B:
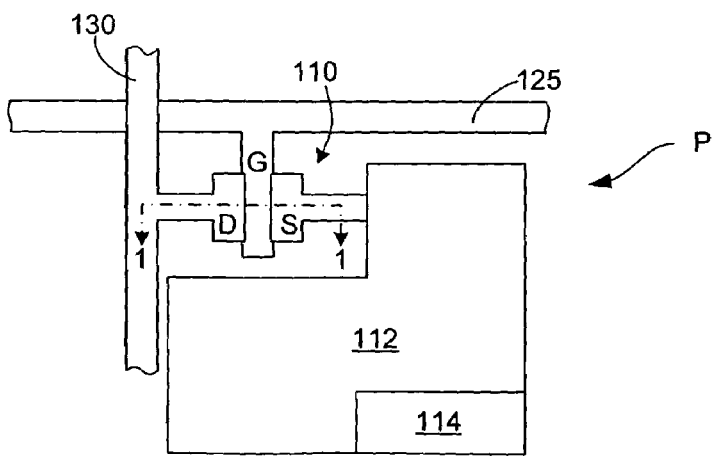
FIG. 2(B) is an enlarged diagram showing a pixel of the display device of FIG. 2(A) in additional detail.

FIG. 2(B) shows a pixel P of backplane circuit 100 in additional detail. Each OTFT 110 has three electrical connections: a source contact structure S connected to sensor 112 and pixel storage capacitor 114; a drain contact structure D that is integrally connected to an associated data line 130, which is integrally connected to the drain contact structures of all OTFTs arranged in the same column with OTFT 110; and a gate contact structure G that is integrally connected to a corresponding gate line 125, which is integrally connected to the gate contact structures of all OTFTs arranged in the same row with OTFT 110. Note that FIG. 1 is taken along section line 1-1 of FIG. 2(B), thus showing a portion of data line 130.

Referring again to FIG. 1, source contact structure S, drain contact structure D, and associated data line 130 of each OTFT 110 are simultaneously and integrally fabricated on upper surface 105U of dielectric layer 105 such that gate structure G is located below a gap separating source contact structures S and drain contact structures D. Gate contact structures G (along with gate lines 125; see FIGS. 2(A) and 2(B)) of each OTFT 110 are formed on upper surface 101U of substrate 101 during a first metallization procedure, then dielectric layer 105 is formed over substrate 101 and gate contact structures G. Source contact structure S, drain contact structure D, and data lines 130 are then formed on upper surface 105U of dielectric layer 105 during a second metallization procedure that is described in detail below, and then an organic semiconductor region 115 is disposed in a gap separating each source/drain pair (e.g., between source contact structure S and drain contact structure D). After completing transistors 110 and data lines 130 in this manner, further processing is performed, for example, to provide image sensors 112 over OTFTs 110.

In accordance with the present invention, source contact structure S, drain contact structure D, and data lines 130 are each formed by multiple layer (multi-layer) structures (e.g., structure 117-1 and 117-2), where each multi-layer structure (e.g., structure 117-1) includes a relatively thick base portion (e.g., 118-1) that is formed using a relatively inexpensive first material metal (e.g., copper or aluminum), and a relatively thin contact layer (e.g., contact layer 119-1) that is formed using a material that provides a relatively good electrical contact (low electrical contact resistance) to organic semiconductor 115 and allows for good carrier injection (e.g., gold or another precious metal, or a conductive polymer such as poly(3,4-ethylenedioxythiophene) (PEDOT) and polyaniline (PANI)) having relatively good electrical contact and a relatively high work function. By utilizing multi-layer structures 117-1 and 117-2, the good electrical contact/high work function material utilized to produce contact layers 119-1 and 119-2 facilitates substantially more efficient carrier injection into organic semiconductor 115 than that exhibited by conventional OTFTs formed using aluminum only. However, unlike conventional gold-only contact structures, the amount of relatively expensive good electrical contact/high work function material is minimized by the use of low cost base portions 118-1 and 118-2, which exhibits relatively poor electrical contact to organic semiconductor 115, but preserves the reliable conductivity of associated data line 130, thus facilitating the formation of contact layers 119-1 and 119-2 that are extremely thin without risking high address line resistance.

In accordance with an aspect of the present invention, contact layers 119-1 and 119-2 are formed on one or more surfaces of associated base portions 118-1 and 118-2. For example, contact layer 119-1 is shown in FIG. 1 as having one or more horizontal portions located over an upper surface 118U of base portion 118-1 and/or under a lower surface 118L of base portion 118-1. In addition, contact layer 119-1 is shown as including a vertical portion located along a side surface 118s of base portion 118-1. As set forth in the specific embodiments described below, contact layer 119-1 typically includes zero or one (i.e., upper or lower) horizontal portion, and may or may not include the side portion.

In accordance with another aspect of the present invention, contact layers 119-1 and 119-2 are integrally formed as thin as possible by providing at least a portion of contact layer 119-1 and contact layer 119-2 (e.g., layer portions 119-11 and 119-21) in associated interface regions 116-1 and 116-2 defined by the junction of the source/drain contact structures S and D, the underlying dielectric layer 105 and portions 115-1 and 115-2 of organic semiconductor region 115. If gold (or another expensive material) is to be used at all in the formation of OTFT contact structures, it is desirable to use as little as possible. One strategy is to thin contact layers 119-1 and 119-2 to reduce the amount of gold utilized in the fabrication process, thus reducing overall manufacturing costs. Because injection in an OTFT occurs very close to gate dielectric 105 (in vertical distance), which is indicated in FIG. 1 by interface regions 116-1 and 116-2, thinning the gold contact layer will not degrade the individual device performance if the contact layer is at least partially located in this interface region. However, as mentioned above, simply thinning the gold contact layer will increase its resistance and is undesirable for a large area display address lines. This resistance issue is prevented by the presence of thick base portions 118-1 and 118-2. Therefore, multi-layer contact structures 1l7-1 and 117-2 facilitate good charge injection and low resistance address lines while minimizing fabrication costs by combining inexpensive base portions 118-1 and 118-2 with contact layers 119-1 and 119-2 having portions 119-11 and 119-21 that are located in interface regions 116-1 and 116-2.

Figure 3A:
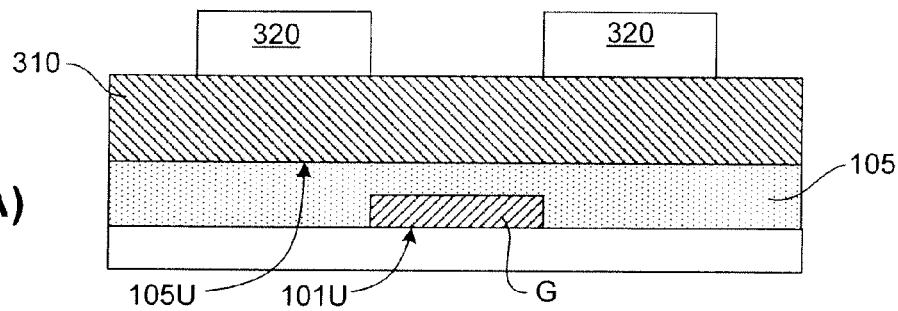
FIGS. 3(A), 3(B), 3(C) and 3(D) are cross-sectional side views showing the fabrication of a TFT backplane circuit according to an embodiment of the present invention.
Figure 3B:
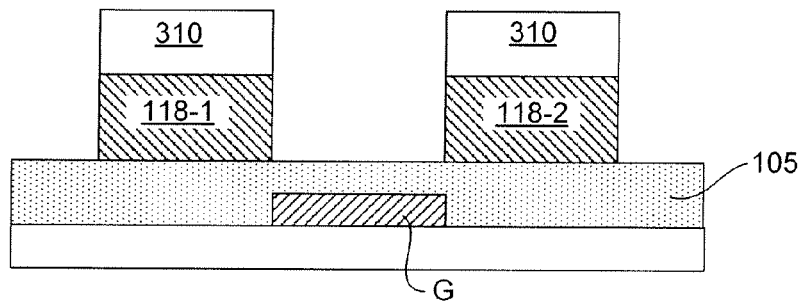
Figure 3C:
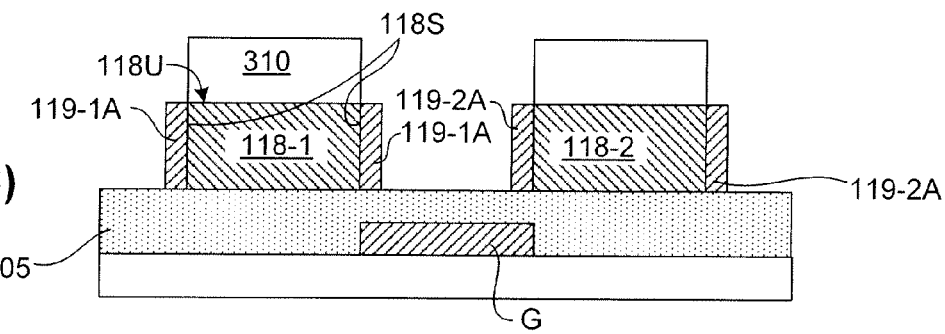
Figure 3D:
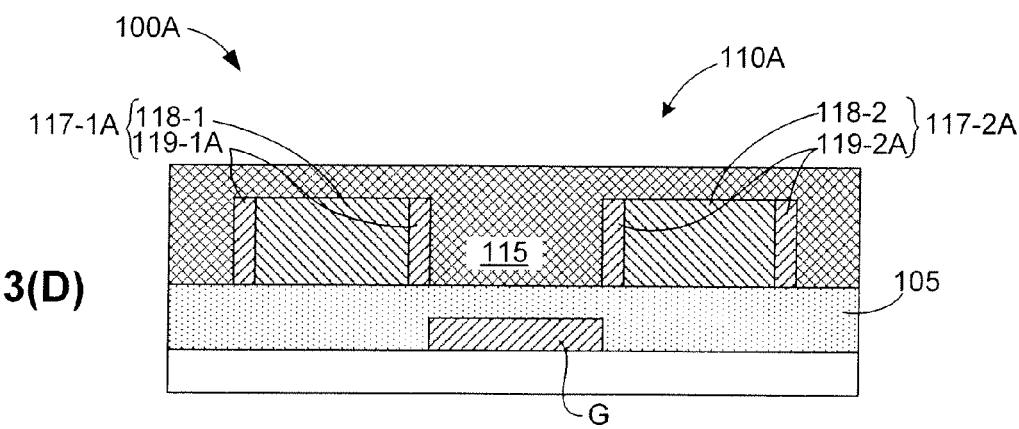

FIGS. 3(A) to 3(D) illustrate a method for fabricating a backplane structure according to an embodiment of the present invention. Referring to FIG. 3 (A), gate electrode G is deposited and patterned according to known techniques using a suitable conductive material (e.g., aluminum). Dielectric layer 105 is then formed over gate electrode and exposed portions of substrate upper surface 101U. A highly conductive metal (e.g., copper) layer 310 is then formed on upper surface 105U of dielectric layer 105, and then a resist or other mask material is deposited and patterned to form mask structures 320. Referring to FIG. 3(B), the copper layer is then etched using known techniques to integrally form base portions 118-1 and 118-2, which are separated by a gap located over gate structure G, along with the base portions of other OTFTs and data lines (not shown) of the backplane circuit. Referring to FIG. 3(C), electroless plating is then performed by immersion of the substrate in a gold plating solution, such as "Bright Electroless Gold" available from Transene Inc. (Danvers, Mass.) causing a thin layer of gold to be coated onto exposed surfaces of base portions 118-1 and 118-2. Note that, in the present embodiment, resist mask 310 is retained on upper surfaces 118U of base portions 118-1 and 118-2, which results in the formation of contact layers 119-1A only on the exposed side surfaces 118S of base portion 118-1, and contact layers 119-2A on the exposed side surfaces of base portion 118-2. A polymer contact layer is formed by treating the base portion in a chemical bath to prepare the base portion for attachment of the polymer. As indicated in FIG. 3(D), depositing organic semiconductor layer 115 into the gap separating the resulting bilayer structures 117-1A and 117-2A completes the fabrication of OTFT 110A. As described above, completed backplane circuit 100A includes multiple OTFT 110A and address lines (not shown) that are substantially identical in cross section to contact structures 117-1A and 117-2A.

Figure 4A:
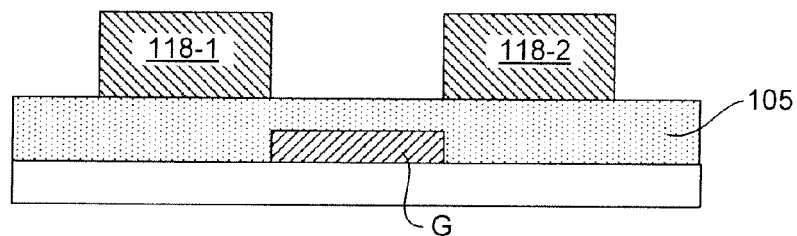
FIGS. 4(A), 4(B) and 4(C) are cross-sectional side views showing the fabrication of a TFT backplane circuit according to another embodiment of the present invention.
Figure 4B:
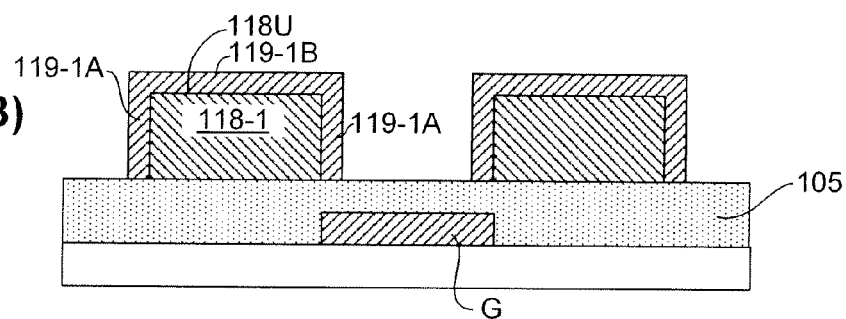
Figure 4C:
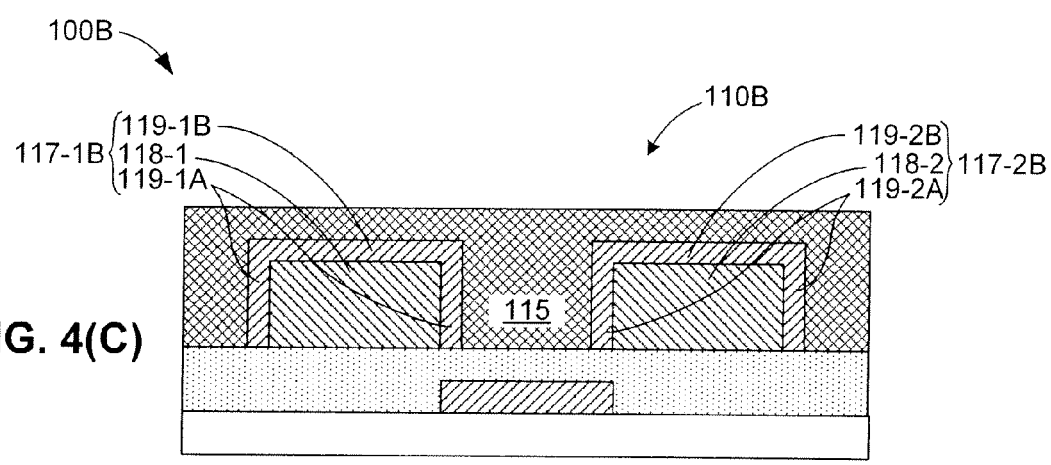

FIGS. 4(A) to 4(C) show an alternative embodiment in which the mask is removed from base portions 118-1 and 118-2 prior to plating (FIG. 4(A)), whereby the plating process produces, in addition to contact layers 119-1A, contact layers 119-1B formed on upper surface 118U of base portion 118-1 (FIG. 4(B)). As indicated in FIG. 4(C), completed OTFT 110B includes contact structures 117-1B and 117-2B that include base portions 118-1 and 118-2, side contact layer portions 119-1A and 119-2A, and upper contact layer portions 119-1B and 119-2B, with organic semiconductor layer 115 deposited as describe above, Of course, as described above, completed backplane circuit 100B includes multiple OTFT 110B and address lines (not shown) that are substantially identical in cross section to contact structures 117-1B and 117-2B.

Several alternative structures and fabrication methods may be utilized to produce backplane circuits that benefit from at least some of the advantages provided by the present invention.

Figure 5:
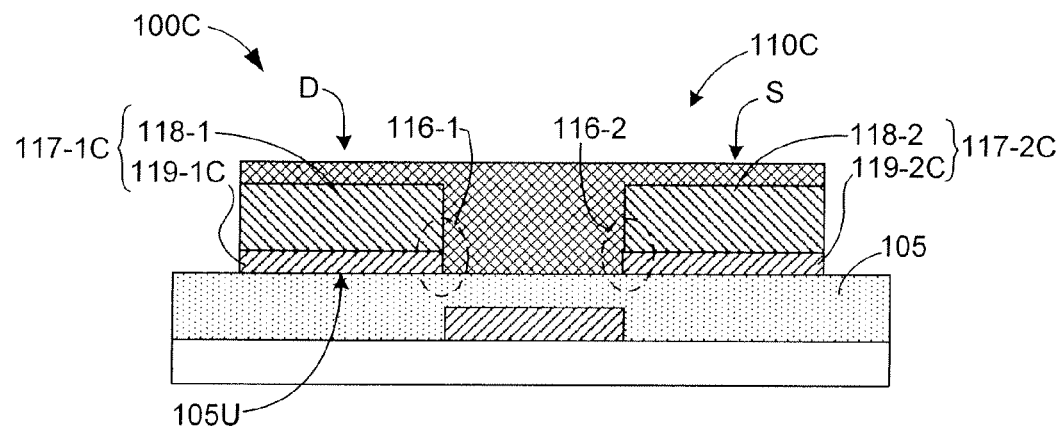
FIG. 5 is a cross-sectional side view showing a TFT backplane circuit according to another embodiment of the present invention.

For example, FIG. 5 shows a backplane circuit 100C including an OTFT 110C in which drain structure D is formed by a multi-layer contact structure 117-1C in which base portion 118-1 is located over a contact layer portion 119-1C, and source structure S is formed by a multi-layer contact structure 117-2C in which base portion 118-2 is located over a contact layer portion 119-2C. This arrangement is produced, for example, by depositing and then using a single mask and two separate etchants to pattern the base portion material and the contact layers. Contact structures 117-1C and 117-2C can be fabricated by simply depositing a thin contact layer material on an upper surface 105U of dielectric layer 105 using standard methods (e.g. sputtering), depositing the base portion material on the contact layer material, patterning the stack using one lithography step (i.e., forming one mask), and then using a two-step etching process to etch the base and contact layer materials. Note that the resulting contact layer portions 119-1C and 119-1C include portions located in interface regions 116-1 and 116-2, respectively. An advantage of the electroless plating method (described above with reference to FIGS. 3(A) to 3(D)) over this two-step etching approach is that recovering the etched gold is difficult and expensive, thereby making the electroless plating method less expensive to perform.

Although the invention has been described above with reference to a bilayer arrangement, one or more additional layers may be included in the fabrication process. For example, a trilayer source/drain/address line structure may be produced in which the highly conducting base portion metal is aluminum with a thin bimetallic contact layer including electrolessly plated nickel and gold. The process flow is similar to that described above with reference to FIGS. 3(A) to 3(D), except that two separate electroless plating steps are required to deposit the nickel layer (ENPLATE NI-431 available from Enthone Inc. (West Haven, Conn.) followed by the gold layer (with an optional intervening zinc layer using a bath such as ALUMON-5825 from Enthone Inc., West Haven Conn.). In another embodiment, a multi-layer structure may be produced in which a thin layer of chromium and a thin layer of gold are deposited before deposition of the thicker base layer of TiW followed by standard photolithographic patterning.

Figure 6:
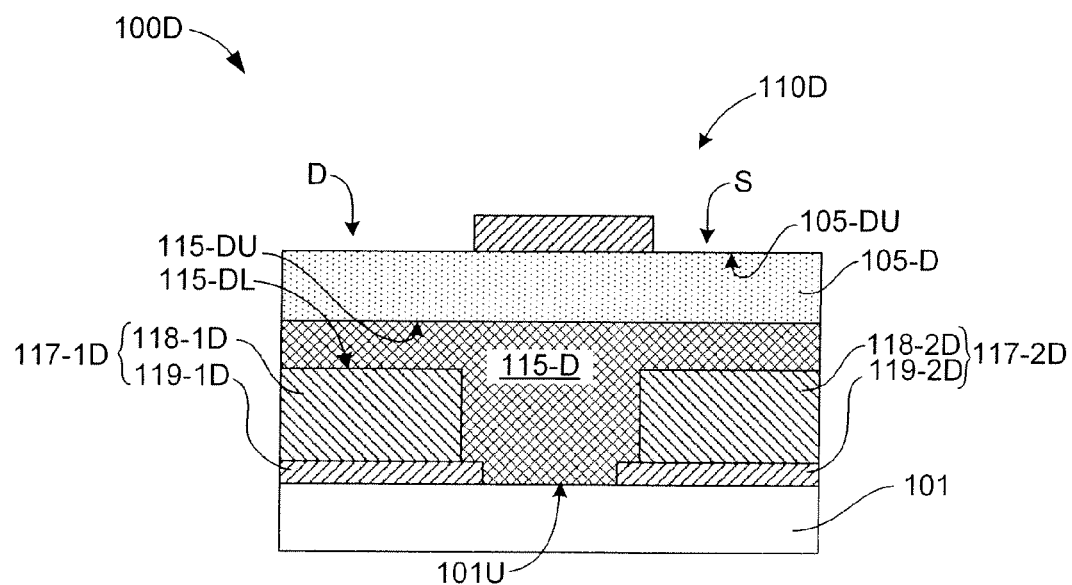
FIG. 6 is a cross-sectional side view showing a TFT backplane circuit according to another embodiment of the present invention.

Although the present invention preferably includes a portion of the contact layer located in the interface region, the reduced-cost benefits of the present invention may be realized by forming source/drain and address line structures that do not include a portion of the contact layer in the interface region, or where the gate structure is positioned away from the interface region. For example, referring to FIG. 4(C), an alternative embodiment may be formed that includes contact layer portions 119-1B and 119-2B, but omits side portions 119-1A and 119-2A. FIG. 6 shows a portion of another backplane circuit 100D including an OTFT 110D in which drain contact structure D and source contact structure S are formed on an upper surface 101U of substrate 101, and the contact layers of multi-layer contact structure 117-1D and 117-2D include portion 119-1D and 119-2D disposed between upper surface 101U and a lower surface 115-DL of organic semiconductor region 115-D. A dielectric layer 105D is formed over an upper surface 115-DU of organic semiconductor region 115-D, and a gate structure G is located on dielectric layer 105-D. OTFT 110D is considered less preferable due to the relatively large distance between gate electrode D and drain contact structure D and source contact structure S. In some cases, as indicated in FIG. 6, a standard etching process may expose a portion of layer 119-1D and 119-2D extending a small distance beyond 118-1D and 118-2D respectively allowing for better injection to the channel region.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A thin-film transistor backplane circuit comprising:
   a substrate;
   a dielectric layer formed on the upper surface of the substrate;

a plurality of thin-film transistors formed on the dielectric layer, each of the thin-film transistors including a drain contact structure, a source contact structure, and an organic semiconductor region disposed between the source and drain contact structures;

a plurality of readout amplifiers disposed adjacent to said plurality of thin-film transistors; and a plurality of address lines formed on the dielectric layer, each address line connecting the drain contact structures of a column of said plurality of thin-film transistors with an associated readout amplifier of said plurality of readout amplifiers, wherein each of the plurality of address lines extending from said column of said plurality of thin-film transistors to said associated read-out amplifier and the source and drain contact structures of each of the plurality of transistors respectively comprise a multi-layer structure including a base portion and a contact layer, wherein the base portion comprises a first material and includes a lower surface, an upper surface extending parallel to the lower surface, and opposing side surfaces extending between the lower and upper surfaces, and wherein the contact layer comprises a second material that is different from the first material, and the contact layer includes:

a first portion that is disposed between the base portion and a side surface of the organic semiconductor region, and extends from the dielectric layer to the upper surface of the base portion, and a second portion formed opposite to at least one of the upper surface, the lower surface of the base portion, and at least one of the opposing side surfaces, wherein the second portion extends along said each of the plurality of address lines to an associated one of said source and drain contact structures, wherein the first material of the base portion consists essentially of one of aluminum and copper, and wherein the second material of the contact layer comprises one of nickel, gold, palladium, platinum and a conductive polymer.

2. The backplane circuit according to claim 1, wherein each thin-film transistor defines a first interface region located between a first base portion of an associated drain contact structure and a first portion of an associated organic semiconductor region, and a second interface region located between a second base portion of an associated source contact structure and a second portion of said associated organic semiconductor region, wherein at least a portion of a first contact layer of the associated drain contact structure is located in the first interface region, and wherein at least a portion of a second contact layer of the associated source contact structure is located in the second interface region.

3. The backplane circuit according to claim 1, wherein the first material of the base portion has a first thickness, and wherein the second material of the contact layer has a second thickness, and wherein the first thickness is five times the second thickness.

4. The backplane circuit according to claim 3, wherein the first material comprises aluminum, and wherein the second material comprises one of poly(3,4-ethylenedioxythiophene) (PEDOT) and polyaniline (PANI).

5. The backplane circuit according to claim 3, wherein the first material comprises copper.

6. The backplane circuit according to claim 3, wherein the first material comprises aluminum, and wherein the contact layer comprises a first layer of nickel formed on the aluminum, and a second layer of gold formed on the nickel.

7. The backplane circuit according to claim 1, further comprising:

a plurality of gate structures formed on an upper surface of the substrate;

wherein the drain contact structure, the source contact structure, and the organic semiconductor region of each of the plurality of thin-film transistors are formed on an upper surface of the dielectric layer and arranged such that each gate structure is located under said organic semiconductor region.

8. The backplane circuit according to claim 1, wherein the second portion of the contact layer comprises first and second contact layers respectively disposed on the opposing side surfaces of the base portion.

9. The backplane circuit according to claim 1, wherein the second portion of the contact layer is disposed on the upper surface of the base portion.

10. The backplane circuit according to 1, wherein the second portion of the contact layer is disposed between the upper surface of the dielectric layer and the lower surface of the base portion.

11. A thin-film transistor backplane circuit comprising:

a plurality of thin-film transistors, each of the thin-film transistors including a drain contact structure, a source contact structure, and an organic semiconductor region disposed between the source and drain contact structures;

a plurality of readout amplifiers disposed adjacent to said plurality of thin-film transistors; and a plurality of address lines, each address line connecting the drain contact structures of a column of said plurality of thin-film transistors with an associated readout amplifiers of said plurality of readout amplifiers, wherein each of the plurality of address lines extending from said column of said plurality of thin-film transistors to said associated read-out amplifier and the source and drain contact structures of each of the plurality of transistors respectively comprise a multi-layer structure including a base portion and a contact layer, wherein the base portion consists essentially of one of aluminum and copper, includes a lower surface, an upper surface extending parallel to the lower surface, and a side surface extending between the lower and upper surfaces, and wherein the contact layer comprises one of nickel, gold, palladium, platinum and a conductive polymer, and includes:

a first portion that is disposed between the base portion and a side surface of the organic semiconductor region, and extends from the lower surface of the base portion to the upper surface of the base portion, and a second portion formed opposite to at least one of the upper surface, the lower surface of the base portion, and the side surface of the base portion, wherein the second portion extends along said each of the plurality of address lines to an associated one of said source and drain contact structures, wherein the drain contact structure and the source contact structure are formed under a lower surface of the organic semiconductor region, and wherein the backplane circuit further comprises:
  a dielectric layer formed on an upper surface of the organic semiconductor region; and
  a plurality of gate structures formed on an upper surface of the dielectric layer.

12. A thin-film transistor backplane circuit comprising:
a dielectric layer having an upper surface;
a plurality of thin-film transistors, each of the thin-film transistors including a drain contact structure, a source contact structure, and an organic semiconductor region disposed between the source and drain contact structures; wherein the drain contact structure, the source contact structure, and the organic semiconductor region of each of the plurality of thin-film transistors are formed on the upper surface of the dielectric layer such that each of the contact structure, the source contact structure, and the organic semiconductor region contact the upper surface of the dielectric layer;
a plurality of readout amplifiers disposed adjacent to said plurality of thin-film transistors; and
a plurality of address lines, each address line connecting the drain contact structures of a column of said plurality of thin-film transistors, with an associated readout amplifier of said plurality of readout amplifiers,
wherein each of the plurality of address lines extending from said column of said plurality of thin-film transistors to said associated read-out amplifier and the source and drain contact structures of each of the plurality of transistors respectively comprise a multi-layer structure including a base portion and a relatively thin contact layer, wherein the base portion is thicker than the contact layer,
wherein each thin-film transistor defines a first interface region located between a first base portion of an associated drain contact structure and a first portion of an associated organic semiconductor region, and a second interface region located between a second base portion of an associated source contact structure and a second portion of said associated organic semiconductor region,
wherein at least a first portion of a first contact layer of the associated drain contact structure is located in the first interface region such that the first base portion is entirely separated from the first portion of said associated organic semiconductor region by the first portion of the first contact layer, and
wherein at least a first portion of a second contact layer of the associated source contact structure is located in the second interface region such that the second base portion is entirely separated from the second portion of said associated organic semiconductor region by the first portion of the second contact layer, wherein the base portion comprises a first material consisting essentially of one of aluminum and copper, and
wherein the contact layer comprises a second material including one of nickel, gold, palladium, platinum and a conductive polymer.

13. The backplane circuit according to claim 12,
wherein the first material comprises aluminum, and
wherein the second material comprises one of poly(3,4-ethylenedioxythiophene) (PEDOT) and polyaniline (PANI).

14. The backplane circuit according to claim 12,
wherein the first material comprises copper.

15. The backplane circuit according to claim 12,
wherein the first material comprises aluminum, and
wherein the contact layer comprises a first layer of nickel formed on the aluminum, and a second layer of gold formed on the nickel.

16. The backplane circuit according to claim 12, further comprising:
  a substrate; and
  a plurality of gate structures formed on an upper surface of the substrate,
  wherein the dielectric layer is formed on the upper surface of the substrate over the gate structures, and
  wherein the dielectric layer is formed on the upper surface of the substrate over the gate structures, and
  wherein the drain contact structure, the source contact structure, and the organic semiconductor region of each of the plurality of thin-film transistors are formed on the upper surface of the dielectric layer such that each gate structure is located under said organic semiconductor region.

17. The backplane circuit according to claim 16, wherein each of the first and second base portions comprises a lower surface disposed on the upper surface of the dielectric layer, and a side surface extending away from the lower surface adjacent to the organic semiconductor region, and an upper surface extending parallel to the lower surface and located at an upper end of the side surface.

18. The backplane circuit according to claim 17,
wherein each of the first and second contact layers further comprises a second portion disposed on the upper surface of an associated one of the first and second base portions.

19. The backplane circuit according to claim 17, wherein each of the first and second contact layers comprises a second portion disposed between the upper surface of the dielectric layer and the lower surface of an associated one of the first and second base portions.

* * * * *

UNITED STATES PATENT AND TRADEMARK OFFICE
CERTIFICATE OF CORRECTION

PATENT NO. : 7,566,899 B2  
APPLICATION NO. : 11/316551  
DATED : July 28, 2009  
INVENTOR(S) : Michael L. Chabinyc et al.

Page 1 of 1

It is certified that error appears in the above-identified patent and that said Letters Patent is hereby corrected as shown below:

In the Specification:

Column 1, line 8, please delete "70NANBOH3033" and insert --70NANB0H3033--.

Signed and Sealed this
Tenth Day of September, 2013

Teresa Stanek Rea
*Acting Director of the United States Patent and Trademark Office*